United States Patent [19]
Nakagawara

[11] Patent Number: 5,345,416
[45] Date of Patent: Sep. 6, 1994

[54] HIGH DENSITY NONVOLATILE MEMORY AND DECODER OF THE SAME

[75] Inventor: Akira Nakagawara, Kanagawa, Japan

[73] Assignee: Sony Corporation, Tokyo, Japan

[21] Appl. No.: 928,442

[22] Filed: Aug. 12, 1992

[30] Foreign Application Priority Data

Aug. 29, 1991 [JP] Japan .................. 3-218425

[51] Int. Cl.$^5$ ........................... G11C 13/00
[52] U.S. Cl. ..................... 365/185; 365/182; 365/184
[58] Field of Search ............ 365/185, 189.11, 184, 365/182, 189.09, 218, 201, 104

[56] References Cited

U.S. PATENT DOCUMENTS 5,202,848  4/1993  Nakagawara ............... 365/104
5,204,835  4/1993  Eitan ....................... 365/185

Primary Examiner—Eugene R. LaRoche
Assistant Examiner—Son Mai
Attorney, Agent, or Firm—Hill, Steadman & Simpson

[57] ABSTRACT

A non-volatile memory comprises memory cells M arranged in a matrix (MB), word lines (W1 to Wn) for row selection, sub-bit lines (B: B12, B21, B22, B31), sub-column lines (C: C11, C12, C22), a column selection circuit 1, a bit line selection circuit 2, and a column line selection circuit 3. The word lines (W1 to Wn) are used as gates common to the rows of the memory cells M, a group of sub-bit lines B and sub-column lines C is selected by the column selection circuit 1, an even-numbered or odd-numbered sub-bit line B is selected from each group and connected to any one of main bit lines (B1, B2 and B3) by the bit line selection circuit 2, and an even-numbered or odd-numbered sub-column line (C) is selected from each group and connected to any one of main column lines (C1 and C2) by the column line selection circuit 3.

17 Claims, 11 Drawing Sheets

1

HIGH DENSITY NONVOLATILE MEMORY AND DECODER OF THE SAME

BACKGROUND

This invention relates to non-volatile memories, and more particularly to non-volatile memories having memory cells of floating gate type.

One previously proposed non-volatile memory is the erasable and programmable read only memory (EPROM) described in, for example, Japanese laid-open patent specification 3/34470.

FIG. 9 is a diagram of the above-mentioned nonvolatile memory, which has connected therein a memory cell array 51, a row decoder 52, a column decoder 53, a column selection logic circuit 54, and a load circuit 55. FIG. 10 is a circuit diagram of the main parts of the memory cells, the load circuit 55 and the column selection logic circuit 54. FIG. 11 is a plan view of the memory cell array, and FIG. 12 is a perspective view of the memory cell corresponding to part of FIG. 11.

In this non-volatile memory, as shown in FIG. 12, aligned N type impurity-diffused layers 64 and 65 are formed on a silicon substrate 61 of, for example, P type, by ion implantation through the mask of a first polycrystalline silicon layer 63 which is formed on a first gate insulating film 62 on the substrate 61, and then a second gate insulating film 66 is formed over the substrate 61.

Thereafter, control gates 67 (which constitute the word lines) formed by strip-shaped second polycrystalline silicon layers are formed perpendicular to the impurity-diffused layers 64 and 65, and then the underlying second gate insulating film 66 and the first polycrystalline layer 63 are selectively etched away in a self-alignment manner through the mask of the control gates 67, so that floating gates formed by the first polycrystalline silicon layers 63 are built up on the substrate 61.

As shown in FIG. 11, the impurity-diffused layers 64 and 65 are alternately used as the bit lines and column lines, and channels are formed in the regions under the control gates 67 between the bit lines and the column lines, thus creating a large number of cells (M11, M12 . . . M33 . . .) for the achievement of a high-density integrated non-volatile memory.

The operation of the above non-volatile memory will now be described with reference to FIGS. 9 and 10.

When a word line Wn of, for example, the nth row is selected by an input row address to the row decoder 52, and when a column selection line Cn of, for example, the nth column is selected by an input column address to the column decoder 53, the word line Wn and the column selection line Cn are raised to a high level, and the other word lines and column selection lines of the other rows and columns stay at a low level.

At this time, transistors Q11, Q12 and Q13 connected to the column selection line Cn of the nth column are turned on, thus allowing a column line CLn to undergo discharge, and hence to be fixed to earth potential Vss. In addition, data paths are formed running from the odd and even bit lines, B1 and B2, to the odd and even data buses, DBL1 and DBL2, respectively. When the word line Wn of the nth row is selected, the memory cells (Q8 and Q9 as illustrated) connected to the word line Wn are selected.

At this time, if the memory cell Q8 is programmed to be logic "0", the memory cell Q8 remains in the off-state, and no signal is transmitted to the odd data bus DBL1. If the memory cell Q9 has no logic "0" written therein, or is programmed to be logic "1", the memory cell Q9 becomes in the on-state, and thus a current path is formed running from the even data bus DBL2 through the transistor Q13 to earth.

All the column lines and bit lines in the non-selected state are biased through transistors Q5, Q6 and Q7 by a slightly higher voltage, Vcc, than the transition point of a sensing amplifier, not shown, connected to the odd and even data buses DBL1 and DBL2. This bias voltage prevents an unnecessarily large voltage change occurring when the bit lines which previously underwent discharge to drop to earth potential Vss are accessed.

Upon writing (programming), the word line Wn of the nth row and the column selection line Cn of the nth column are charged substantially to a program potential Vpp ($>$Vcc). When the memory cell Q8 is not programmed, the odd data bus DBL1 is at the low level. When the logic "0" is programmed in the memory cell Q9, the even data bus DBL is raised to the program potential Vpp as described above.

This non-volatile memory has the following problems when the number of word lines is increased for high-density integration.

Firstly, the wiring resistance of the N type impurity-diffused layer for the bit lines or column lines is increased in proportion to the number of word lines. In other words, the memory cell current flowing in the memory cell is limited by the parasitic resistance inserted in series with the source and drain of the memory cell. Therefore, upon reading of data, the current flowing from the data bus to the memory cell decreases, so that the time during which the data bus is subjected to discharge becomes long. As a result, the access time is increased, so that it is difficult to read data at a high speed.

Secondly, since the bit lines and column lines constituting the memory cell array are made of the N type impurity-diffused layer, the junction capacitance between the impurity-diffused layer and the silicon substrate is added as a parasitic capacitance, thus increasing the time of discharge through the bit lines and column lines which precedes the discharge through the data bus.

Thirdly, since the memory cell current is limited by the series resistance of the source and drain of the memory cell, it is difficult to assure the current for writing data in the memory cell. The writing current usually needs to be about 1 mA. Since the writing voltage is specified generally as 12.5±0.5V, it is absolutely necessary that the total resistance of the resistance of the bit line and column line and the working resistance of the memory cell be 12.5 k$\Omega$ or below.

The sheet resistance of an N type impurity-diffused layer is usually 10 to 50 $\Omega$/☐. In addition, referring to FIG. 12, if the first polycrystalline silicon layer (floating gate) 63 and the second polycrystalline silicon layer (control gate) 67 are designed on the same rule, the resistance value of the N type impurity-diffused layers 64 and 65 per row is at least 20 $\Omega$, and thus the number of rows (=the number of word lines) cannot be increased to 625 or above because the total resistance of the impurity-diffused layers becomes about 12.5 k$\Omega$.

This means that when the number of rows is selected to be equal to that of columns in accordance with the structure of the typical memory cell array 51, it is difficult to realize a larger-capacity non-volatile memory using the above high-density memory cells than 256 kbits.

Moreover, when the memory cells are integrated at a high density, the numbers of bit lines and column lines are increased with the increase of the number of memory cells, and thus it is also necessary to increase the number of the output terminals of the peripheral circuits such as the column decoder 53 and the load circuit 55. Since in this non-volatile memory the arrangement pitch of the output terminals of the peripheral circuits is the same as that of the bit lines and column lines in the memory cell array 51, the output terminals of the peripheral circuits must also be considered to be integrated at a high density in accordance with the increase of the integration density of the memory cells. Therefore, it is very difficult to design the non-volatile memory.

SUMMARY OF THE INVENTION

According to the present invention there is provided a non-volatile memory device comprising:
- a plurality of non-volatile memory cells arranged in a matrix configuration and including floating gate type MIS transistors to be programmed to a high threshold voltage or to a low threshold voltage in accordance with programmed data to be written;
- a plurality of word lines used in common in each row of said memory cells and functioning as gates of said MIS transistors; a plurality of sub-bit lines arranged substantially orthogonally to said word lines, wherein said sub-bit lines function as one of the sources or the drains of said MIS transistors and are used in common by one of adjacent columns of said memory cells, and are formed as diffusion regions by introducing impurities of an opposite conductivity type into a substrate surface;
- a plurality of sub-column lines arranged between said sub-bit lines, wherein said sub-column lines are used in common by the other of adjacent sub-columns of said memory cells and function as the other of said sources or drains of said MIS transistors of columns of said memory cells, and are formed as diffusion regions by introducing impurities of an opposite conductivity type into a substrate surface; characterized in that:
- first selection means is arranged for selecting groups each consisting of a plurality of said sub-bit lines and a plurality of said sub-column lines;
- second selection means is arranged for selecting said sub-bit lines in each group and to connect said sub-bit lines to main-bit lines; and third selection means is arranged for selecting said sub-column lines in each group and to connect said sub-column lines to main-column lines.

According to the present invention there is also provided a non-volatile memory device comprising:
- a plurality of non-volatile memory cells arranged in a matrix configuration and including floating gate type MIS transistors, and wherein said memory cells are divided into a plurality of blocks along main-bit lines;
- a plurality of word lines used in common in each row of said memory cells and functioning as gates of said MIS transistors;
- a plurality of sub-bit lines arranged substantially orthogonally to said word lines, wherein said sub-bit lines function as one of the sources or the drains of said MIS transistors and are used in common by one of adjacent columns of said memory cells, and are formed as diffusion regions by introducing impurities of an opposite conductivity type into a substrate surface; and
- a plurality of sub-column lines arranged between said sub-bit lines in alternation with and parallel to said bit lines, wherein said sub-column lines are used in common by the other of adjacent columns of said memory cells and function as the other of said sources or drains of said MIS transistors of columns of said memory cells, and are formed as diffusion regions by introducing impurities of an opposite conductivity type into a substrate surface; characterized in that:
- first selection means is arranged for selecting groups each consisting of a plurality of said sub-bit lines and a plurality of said sub-column lines in common in each block;
- second selection means is arranged for selecting said sub-bit lines in each group and to connect said sub-bit lines to main lines;
- third selection means is arranged for selecting said sub-column lines in each group and to connect said sub-column lines to main-column lines;
- load circuits are arranged at terminal ends of each bit line and each column line; and
- fourth selection means is provided for selecting one of said blocks.

Embodiments of the invention can provide a non-volatile memory in which it is not necessary to decrease the arrangement pitch of the output terminals of the peripheral circuits, so that design of the memory cells can be easily performed, even although the integration density of the memory cells is increased. Moreover a non-volatile memory can be formed at a high density and at a high degree of integration by use of the above high-density memory cells, and is suitable for high-speed operation.

According to the present invention there is also provided a non-volatile memory including memory cells of non-volatile memory elements arranged in a matrix and each of which has a floating gate and a control gate formed to be superimposed like a multilayer, word lines respectively formed common to the rows of the memory cells and which are used as the gate electrodes of the non-volatile memory elements, bit lines respectively formed to be substantially perpendicular to the word lines to be used as one of the common source and common drain of the columns of the non-volatile memory elements of the memory cells, and to be used for reading data from one of adjacent columns of the memory cells column lines formed between the bit lines to be substantially parallel to the bit lines, to be used common to the other one of the adjacent rows of the memory cells, and to be used as the other one of the common source and common drain of the rows of the memory cells of the non-volatile memory cells, first selection means for selecting one of groups each of which is formed of ones of the bit lines and ones of the column lines, second selection means for selecting one of the bits lines of each of the groups, and third selection means for selecting one of the column lines of each of the groups.

In this case, the second and third selection means may be formed of insulating gate type field effect transistors. Also, the second and third selection means may be formed of insulating gate type field effect transistors of the same conductivity as the memory cells. In addition, the bit lines and the column lines may be formed in band-shaped patterns and on a substrate, and the channels of MIS transistors constituting the second and third selection means may be formed in the direction substantially perpendicular to the extension direction of the band-shaped patterns.

Also, the second selection means may be provided to oppose the third selection means through the memory cell array. The memory cells arranged in a matrix may be divided into blocks in the direction of the bit lines, and the first selection means may be used in common for the blocks. A load circuit may be connect to the end of the bit lines and the column lines. The memory cells arranged in a matrix may be divided into blocks in the direction of the bit lines, and the load circuit may be connected in common to the blocks.

According to the present invention there is also provided a non-volatile memory including memory cells of non-volatile memory elements arranged in a matrix, and which are divided in the extension direction of bit lines into a plurality of blocks, each of which has a matrix array of memory cells of non-volatile memory elements which are formed of floating gates and control gates superimposed like a multilayer, word lines respectively formed common to the rows of the memory cells and which are used as the gate electrodes of the non-volatile memory elements, the bit lines respectively formed to be substantially perpendicular to the word lines, to be used as one of the common source and common drain of the columns of the non-volatile memory elements of the memory cells, and to be used for reading data from one of adjacent columns of the memory cells, column lines formed between the bit lines to be substantially parallel to the bit lines, to be used common to the other one of the adjacent columns of the memory cells, and to be used as the other one of the common source and common drain of the columns of the memory cells of the non-volatile memory cells, second selection means for selecting one of the bit lines of one of groups each of which is formed of ones of the bit lines and ones of the column lines, and third selection means for selecting one of the column lines of each of the groups, also first selection means being provided common to the blocks so as to select one of the groups, a load circuit being provided on the ends of the bit lines and the column lines so as to be common to the blocks, whereby the second selection means and the third selection means of only a particular block of the plurality of blocks are selected.

In this case, the word lines may be used in common for the plurality of blocks.

According to the present invention there is also provided a non-volatile memory including memory cells of non-volatile memory elements arranged in a matrix, and which are divided in the extension direction of bit lines into a plurality of blocks, each of which has a matrix array of memory cells of non-volatile memory elements which are formed of floating gates and control gates superimposed like a multilayer, word lines respectively formed common to the rows of the memory cells and which are used as the gate electrodes of the non-volatile memory elements, the bit lines respectively formed to be substantially perpendicular to the word lines, to be used as one of the common source and common drain of the columns of the non-volatile memory elements of the memory cells, and to be used for reading data from one of adjacent columns of the memory cells, column lines formed between the bit lines to be substantially parallel to the bit lines, to be used common to the other common source and common drain of the columns of the memory cells of the non-volatile memory cells, second selection means for selecting one of the bit lines of one of groups each of which is formed of ones of the bit lines and ones of the column lines, and third means for selecting one of the column lines of each of the groups, a load circuit being provided on the ends of the bit lines and the column lines so as to be common to the blocks, whereby the word lines of only a particular block of the plurality of blocks are selected.

In this case, the control signal to the second selection means may be used in common for the plurality of blocks. The control signal to the third selection means may be used in common for the plurality of blocks.

According to the present invention the non-volatile memory may be constructed to have memory cells which are formed of floating gate type field effect transistors and are arranged in a matrix, word lines for selecting rows of the memory cells, bit lines, column lines and first, second and third selection means. The word lines are formed of, for example, polycrystalline silicon layers so as to extend in parallel patterns and to be used as the common gate of each of the rows of the floating gate type insulating gate field effect transistors of the memory cells. In addition, each group of ones of bit lines and ones of column lines is selected by the first selection means. The even-numbered or odd-numbered bit line of each group is selected and connected to any one of the main bit lines by the second selection means. The even-numbered or odd-numbered column line of each of the groups is selected and connected to any one of the main column lines by the third selection means. Therefore, when the main column line is selectively fixed to the earth potential, a current path of the main bit line—bit line—memory cell—column line main column line (imaginary earth line) can be formed which passes only through a particular memory cell.

In other words, the wiring pitch of the main bit lines and main column lines can be increased to twice the pitch of the wiring (diffusion wiring) formed of the impurity diffusion layer. Thus, wiring of metal such as aluminium, of which the pitch is larger than the diffusion wiring, can be used as the main bit lines and main column lines. Accordingly, since the pitch of the wiring drawn out of the memory cell array is much wider than that within the memory cell, the rule for the arrangement pitch of tile output terminals of the peripheral circuits does not need to be severe, so that design is easy.

Moreover, since the bit lines and column lines can be divided into blocks, it is possible to avoid the source-drain series resistance from being increased when the high-density memory cells shown in, for example, FIG. 12 are used. Also, since a particular single block can be selectively connected to the main bit lines, the bit line capacity can be reduced and the data reading operation can be performed at a high speed as compared with the case in which the bit lines are extended in all the blocks.

BRIEF DESCRIPTION OF THE DRAWINGS

The invention will now be described by way of example with reference to the accompanying drawings, throughout which like parts are referred to by like references, and in which.

DESCRIPTION OF THE PREFERRED EMBODIMENTS

Figure 1:
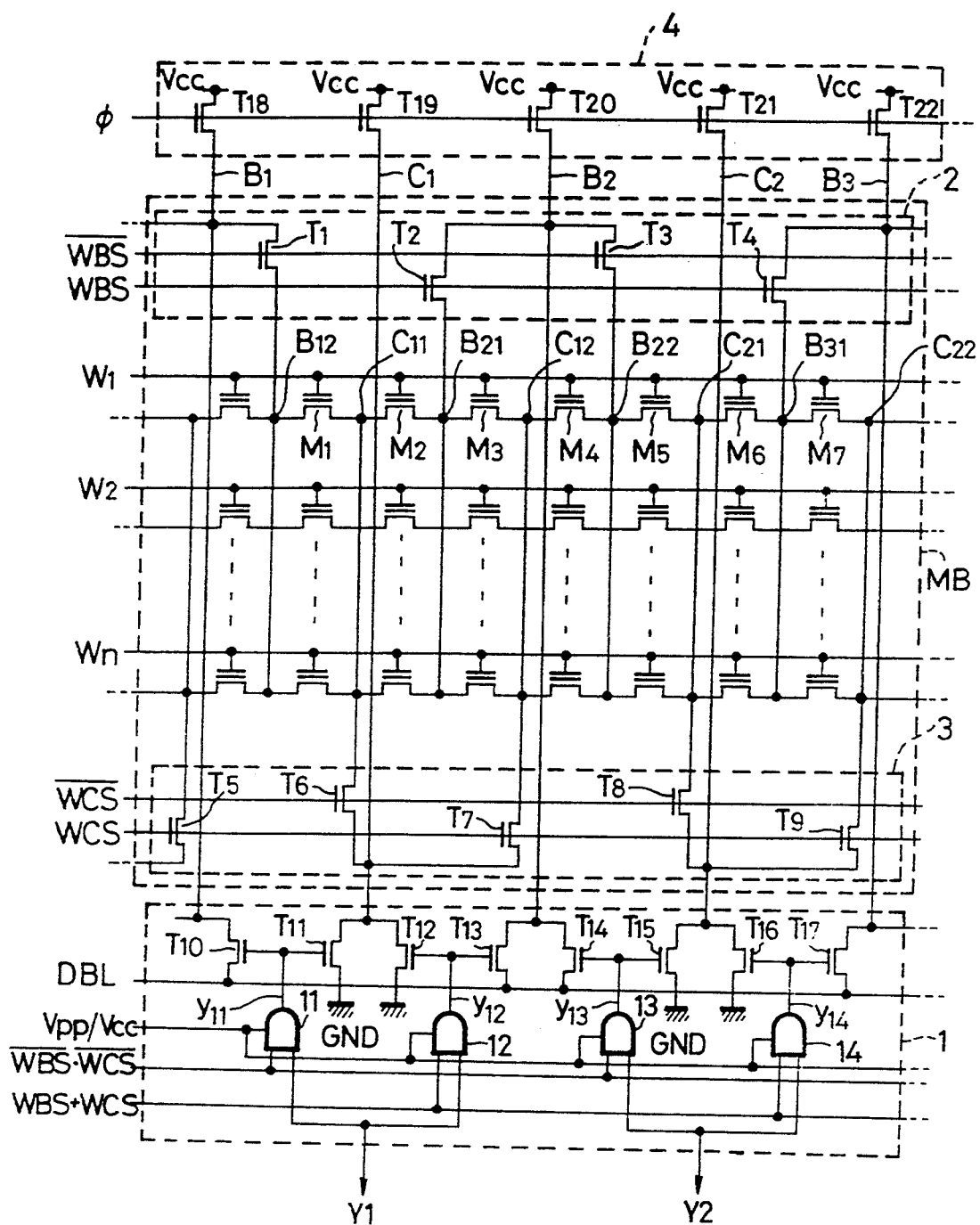
FIG. 1 shows a circuit diagram of a first embodiment of non-volatile memory according to the present invention.

Referring to FIG. 1, this shows part of the memory array of the non-volatile memory of the first embodiment, the structure repeating in the word line direction.

The memory array or block, MB, has memory cells M (M1, M2 ... M7 ...) arranged in a matrix. Each of the memory cells M is formed of a single floating gate type field effect transistor. The rows of the control gate electrodes of these floating gate type field effect transistors constitute word lines W1 to Wn, respectively. These word lines extend in the lateral direction.

Every other one of the source/drain regions of the floating gate type field effect transistors of the respective memory cells M are used as sub-bit lines B(B12, B21, B22, B31), and the other ones of the source/drain regions of the floating gate type field effect transistors of the respective memory cells M are used as sub-column lines C(C11, C12, C21, C22).

The sub-bit lines B and sub-column lines C extend in the longitudinal direction perpendicular to the word lines W1 to Wn. In addition, each of these sub-bit lines B and sub-column lines C is common to the adjacent ones of the floating gate type field effect transistors which are adjacent in the extension direction of the word lines W1 to Wn. Therefore, the sub-bit lines B and the sub-column lines C are alternately formed in the extension direction of the word lines W1 to Wn.

The memory cell block MB has provided at its one end portion a bit line selection circuit 2 which is used as the second selecting means and is formed of MOS transistors T1, T2, T3 and T4 for connecting the even-numbered or odd-numbered ones of the sub-bit lines B12, B21, B22, BB1 to main bit lines, respectively.

In other words, the sub-bit lines B12, B21, B22 and BB1 are connected through the MOS transistors T1, T2, T3 and T4 to the main bit lines B1, B2, B2 and B3, respectively. The MOS transistors T1 and T3 have their gate electrodes connected to a selection line $\overline{WBS}$, and the MOS transistors T2 and T4 have their gate electrodes connected to a selection line WBS. The signals supplied to the selection lines $\overline{WBS}$ and WBS are opposite in phase.

Therefore, when the selection line WBS is at the high level, the main bit line B2, for instance, is connected through the MOS transistor T2 to the sub-bit line B21. On the contrary, when the selection line WBS is at the low level, the same main bit line B2 is connected through the MOS transistor T3 to the sub-bit line B22. For the other main bit lines, the same operation is performed.

The memory block MB has provided at the other end portion a column line selection circuit 3 which is used as the third selecting means and is formed of MOS transistors T5, T6, T7, T8 and T9. The MOS transistors T5, T6, T7 T8 and T9 are used as switches for connecting the even-numbered or odd-numbered ones of the sub-column lines C11, C12, C21 and C22 to the main column lines C1 and C2.

In other words, the main column line C1 is connected through the MOS transistor T6 to the sub-column line C11, and is also connected through the MOS transistor T7 to the sub-column line C12. The main column line C2 is connected through the MOS transistor T8 to the sub-column line C21, and is also connected through the MOS transistor T9 to the sub-column line C22. For the other sub-column lines, the same connection is performed.

The MOS transistors T6 and T8 of the MOS transistors constituting the column line selection circuit 3 have their gate electrodes connected to a selection line $\overline{WCS}$, and the MOS transistors T5, T7 and T9 have their gate electrodes connected to a selection line $\overline{WCS}$. The signal supplied to the selection line WCS and the signal supplied to the selection line WCS are opposite in phase.

Therefore, when the selection line $\overline{WCS}$ is at the high level, the MOS transistors T6 and T8 are turned on, so that the main column line C1 is electrically connected to the sub-column line C11, and at the same time the main column line C2 is electrically connected to the sub-column line C21. On the contrary, when the selection line WCS is at the high level, the M0S transistors T7 and T9 are turned on, so that the main column line C1 is electrically connected to the sub-column line C12, and at the same time the main column line C2 is electrically connected to the sub-column line C22.

The main bit lines B1, B2 and B3 and the main column lines C1 and C2 which are selectively connected to the sub-bit lines and sub-column lines in accordance with the signals fed to the selection lines are extended in the direction perpendicular to the extension direction of the word lines W1 to Wn within the memory cell block MB. In addition, a load circuit 4 is connected to one ends of the main bit lines B1, B2 and BB and the main column lines C1 and C2.

The load circuit 4 is formed of load transistors T18, T19, T20, T21 and T22. Specifically, the load transistors T18, T20 and T22 are connected to the main bit lines B1, B2 and BB, respectively, and the load transistors T19 and T21 are connected to the main column lines C1 and C2, respectively.

The main bit lines and main column lines B1, B2, BB, C1 and C2 are supplied with the source voltage Vcc through the load transistors T18, T19, T20, T21 and T22, respectively. The gate electrodes of the load transistors T18, T19, T20, T21 and T22 are connected together and supplied with a signal $\phi$ for controlling the impedances.

On the opposite side of the memory cell block MB to the load circuit 4, there is provided a column selection circuit 1 forming the first selection means so that the memory cell block MB lies between the load circuit 4 and the column selection circuit 1. The column selection circuit 1 selects an arbitrary column of the memory cell block MB as a group unit in accordance with column selection signals Y1 and Y2 from the column decoder, not shown.

In other words, a main column line to be selected is determined by the signals Y1 and Y2, and which sub-column line that main column line is connected to is decided by the operation of the MOS transistors T5, T6, T7, T8 and T9 of the column line selection circuit 3 of the third selection means.

Moreover a main bit line to be selected is determined by the signals Y1 and Y2, and which sub-bit line that main bit line is connected to is decided by the operation of the MOS transistors T1, T2, T3 and T4 of the bit line selection circuit 2 of the second selection means. The column selection circuit 1 of this embodiment selects a main column line and the main bit line associated with that column line at a time in accordance with the signals Y1 and Y2.

A specific circuit arrangement of the column selection circuit 1 will now be described. The main bit line B1 is connected to a data bus line DBL through a MOS transistor T10 and one more MOS transistor not shown. The main bit line B2 is connected to the data bus line DBL through MOS transistors T13 and T14. The main bit line B3 is connected to the data bus line DBL through a MOS transistor T17 and one more MOS transistor not shown.

The main column line C1 is connected to an earth line GND through MOS transistors T11 and T12. The main column line C2 is connected to the earth line GND through MOS transistors T15 and T16.

The gates of the MOS transistors T10 and T11 are connected to the output terminal of an AND circuit 11 with a level shift function. The gates of the MOS transistors T12 and T13 are connected to the output terminal of an AND circuit 12 with a level shift function. The gates of the MOS transistors T14 and T15 are connected to the output terminal of an AND circuit 13 with a level shift function. The gates of the MOS transistors T16 and T17 are connected to an AND circuit 14 with a level shift function.

Figure 2A:
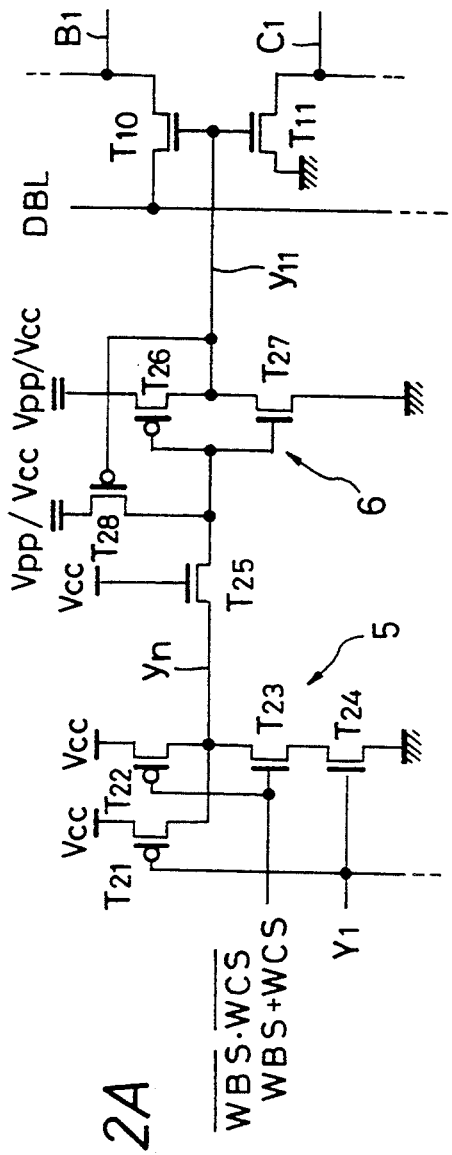
FIG. 2 shows (A) a circuit diagram of one example of a column selection circuit and (B) a logic diagram.
Figure 2B:
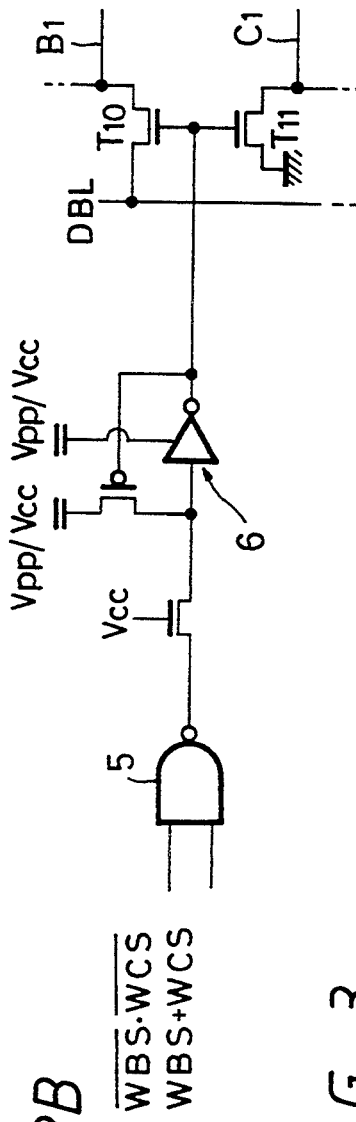

FIG. 2 shows a specific example of these AND circuits 11 to 14 with the level shift function. The AND circuit has a two-input NAND circuit (column selecting logic portion) 5 of MOS transistors T21 to T24 and an inverter (level shifter portion) 6 formed of MOS transistors and having a level shift function. The source terminals of P channel transistors T26 and T28 are connected to the power supply Vpp/Vcc. The source terminals are held at a program potential (the standard value, $5 \pm 0.5$ v) upon reading of data.

When the output $y_n$ of the two-input NAND circuit 5 is the high level, MOS transistors T25 and T27 become conductive, making the output $y_{11}$ become the low level. Thus, the P channel transistor T28 becomes conductive, allowing the input terminal of the inverter 6 of the MOS transistors T26 and T27 to be pulled up to Vpp/Vcc. Thus, the MOS transistor T26 is prevented from being conductive. When the output $y_n$ of the two-input NAND circuit D is the low level, the MOS transistor T27 is made off and the MOS transistor T26 becomes conductive. Thus, the output $Y_{11}$ becomes the potential of Vpp/Vcc, turning the MOS transistor T28 off.

One input terminal of the AND circuits 11, 12, 13 and 14 with the level shift function are supplied with the column selection signals Y1, $\overline{Y1}$, Y2 and $\overline{Y2}$, respectively, and the other input terminals thereof are supplied with the logic product of $\overline{WBS}$ and $\overline{WCS}$, and the logic sum of WBS and WCS, respectively. Therefore, the outputs of the AND circuits 11 and 13 with the level shift function become the high level only when the signals on the selection line $\overline{WBS}$ and the selection line $\overline{WCS}$ are the high level. In the other case, the outputs of the AND circuits 12 and 14 with the level shift function become the high level.

Figure 3:
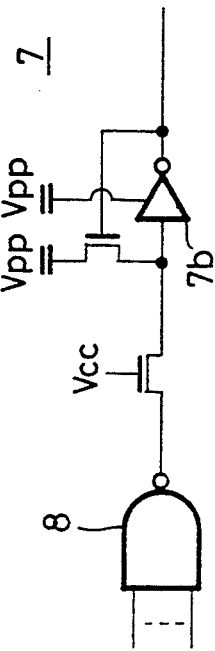
FIG. 3 is a logic diagram of one example of a row selection circuit.

The output of a row selection circuit 7 as, for example, shown in FIG. 3 is connected to the word lines shown in FIG. 1. The row selection circuit 7 is formed of a row selection logic circuit portion 8 and a level shifter portion 7b. The row selection logic circuit portion is, for example, a multi-input NAND circuit 8, and the level shifter portion 7b is, for example, a circuit of the same arrangement as the level shifter portion with is used in the column selection circuit 1 shown in FIG. 2.

Similarly the logic output buffer associated with the selection line WBS and $\overline{WBS}$ is arranged to have the level shift function. The logic output buffer associated with the selection line WCS and $\overline{WCS}$ may be similarly arranged to have the level shift function, but this is not absolutely necessary.

The reason for this is as follows. Upon writing of data, the potential of the main bit line is Vpp-Vth (Vpp is the program potential). This value is higher than the bit line voltage Vcc-Vth (Vth is the threshold voltage of the n-channel MOS transistor). In order to transmit this voltage to the bit line through the MOS transistor T1, T2, TB and T4, it is necessary that the potential of the selection line WBS and $\overline{WBS}$ be pulled up to Vpp. Since the memory of the logic output buffer associated with the selection line WCS and $\overline{WCS}$ is not necessary to be pulled up to Vpp.

The circuit operation of the non-volatile memory of this embodiment shown in FIG. 1 will be described with reference to the column selection circuit of FIG. 2, the row selection circuit of FIG. B and the timing chart of FIG. 4.

The reading operation will first be described. As shown in FIG. 4, when the signal $\phi$ first becomes the high level, the impedances of each of the load transistors T18, T19, T20, T21 and T22 of the load circuit 4 are established to be a predetermined value, and the potentials of the main bit lines B1, B2, B3 and main column lines C1 and C2 are pulled up to the source voltage Vcc for the non-selected state.

The operation for sequential reading of the first-row memory cells M1 to M4 will be described. When the potential of the word line W1 is raised from the low "L" level to the high "H" level, the word line W1 of the first row is selected. The other word lines W2 to Wn are held at the row "L" level potential or shifted to the low "L" level for the non-selected state.

Also, when only the signal Y1 of the signals from the column decoder is first raised from the low "L" level at the high "H" level and the other signal Y2 is held at the "L" level or shifted to the low "L" level. Thus, only the AND circuits 11 and 12 with level shift functions to which the signal Y1 is supplied become operative.

The signal Y1 is raised, and the signals on the selection lines WBS and WCS are supplied to make the second and third selecting means 2 and 3 operative. First, the selection lines WBS and WCS are both held at the low "L" level, and only the AND circuit 11 with the level shift function becomes the high "H" level. The other AND circuits 12 to 14 with level shift functions stay at the low "L" level. Since Vpp=Vcc is satisfied upon reading operation, the high "H" level output voltage of the AND circuit 11 of the level shift function is not shifted in level but is Vcc.

When the AND circuit 11 becomes the high "H" level, the MOS transistors T10 and T11 are made in the on-state, and the MOS transistors T12 to T17 connected to the other AND circuits 12 to 14 are in the cut-off state. Thus, since the MOS transistors T10 and T11 are conductive, the main bit line B1 is electrically connected to the data bus line DBL through the MOS transistor T10.

At the same time, the main column line C1 is electrically connected through the MOS transistor T11 to the earth line GND, and functions as an imaginary earth line. Thus, when the main column line C1 is connected to the earth line GND, the potential of the main column line C1 is reduced.

Moreover, at the same time, since the selection lines WBS and WCS are both at the low "L" level as described above, the MOS transistors T1 and T3 of the second selecting means 2 ape conductive, and the MOS transistors T6 and T6 of the third selecting means B are in the on-state. The other MOS transistors T2, T4, T5, T7 and T9 of the second and third selecting means 2 and 3 remain in the off-state.

Since only the main bit lines B1 and main column line C1 are operative as described above, the main bit line B1 is selectively connected through the MOS transistor T1 to the sub-bit line B12, and the main column line C1 is selectively connected through the MOS transistor T6 to the sub-column line C11. Only the word line W1 of the word lines is in the on-state. Thus, at this stage, the memory cell M1 has been selected.

When this selected memory cell M1 is programmed to be as a high threshold value, the memory cell M1 is not conductive or has a higher impedance the usual, and the potential of the sub-bit line B12 is not reduced or has a lower voltage drop than usual. When the memory cell M1 is programmed to be at a low threshold value, the memory cell M1 is conductive and the potential of the sub-bit line B12 is reduced more than when the memory cell M1 is programmed to be at a high threshold value. The potential of this sub-bit line B12 is transmitted through the MOS transistors T1 and T10 to the data bus line DBL. The known sensing amplifier detects and amplifies the potential change of the data bus line DBL, thus producing the output signal.

After data have been read from the memory cell M1, the selection line is changed from the low "L" level to the high "H" level. At this time, the output $y_{11}$ of the AND circuit 11 selected by the signal Y1 first becomes the low "L" level, and on the contrary the output $Y_{12}$ of the AND circuit 12 is changed to the high "H" level. As a result, the MOS transistor T10 is turned off, and the main bit line B1 is electrically disconnected from the data bus line DBL. Moreover, the main column line C1 is not earthed through the MOS transistor T11, but electrically connected through the MOS transistor T12 to the earth line GND.

In addition, the MOS transistor T13 is turned on, and this time the main bit line B2 is electrically connected through the MOS transistor T13 to the data bus line DBL. Since the selection line WCS remains at the low "L" level, the main column line C1 is connected through the MOS transistor T6 to the sub-column line C11. Since the selection line WBS is changed from the low "L" level to the high "H" level, the MOS transistor T2 is turned on, and the MOS transistor T3 is turned off. Thus, the main bit line B2 is selectively connected through the MOS transistor T2 to the sub-bit line B21.

Thus, when the sub-bit line B21 and sub-column line C11 are selected, the memory cell M2 of the row associated with the same word line W1 has been selected. As in the case of the memory cell M1, the potential of the sub-bit line B21 is changed in accordance with the programmed data, and the potential change appears on the data bus line DBL through the main bit line B2.

In the next cycle, the potential of the selection line WCS is shifted from the low "L" level to the high "H" level for selecting the memory cell M3. At this time, although the output $y_{12}$ of the AND circuit 12 remains at the high "H" level, the MOS transistor T6 connected to the main column line C1 is changed to the off-state, and the MOS transistor T7 is changed to the on-state.

As a result, the sub-column line C11 is disconnected from the main column line C1, and instead the sub-column line C12 is connected thereto. Thus, the memory cell M3 has been selected. As in the case of the memory cell M1, the potential of the sub-bit line B21 is changed in accordance with the programmed data, and the potential change appears on the data bus line DBL through the main bit line B2.

In the next cycle, the potential of the selection line WBS falls from the high "H" level to the "L" level. The result is that the MOS transistor T2 is turned off and that the MOS transistor T3 is turned on. At this time, the sub-bit line B22 is electrically connected to the main bit line B2. In this case, since the main column line C1 is already earthed, and since the main column line C1 is electrically connected through the MOS transistor T7 to the sub-column line C12 and the sub-bit line B22 is selected.

Similarly, data are read on the data bus line DBL from the memory cell M4 through the main bit line B2. The signal Y1 is caused to fall and the signal Y2 is cause to rise. Then, similarly, the selection lines WBS and WCS are controlled to select the memory cell M5 to M7, and data can be read from each memory cell M5 to M7.

The data writing operation for the memory cells M5 to M7 will now be described in order.

Figure 4:
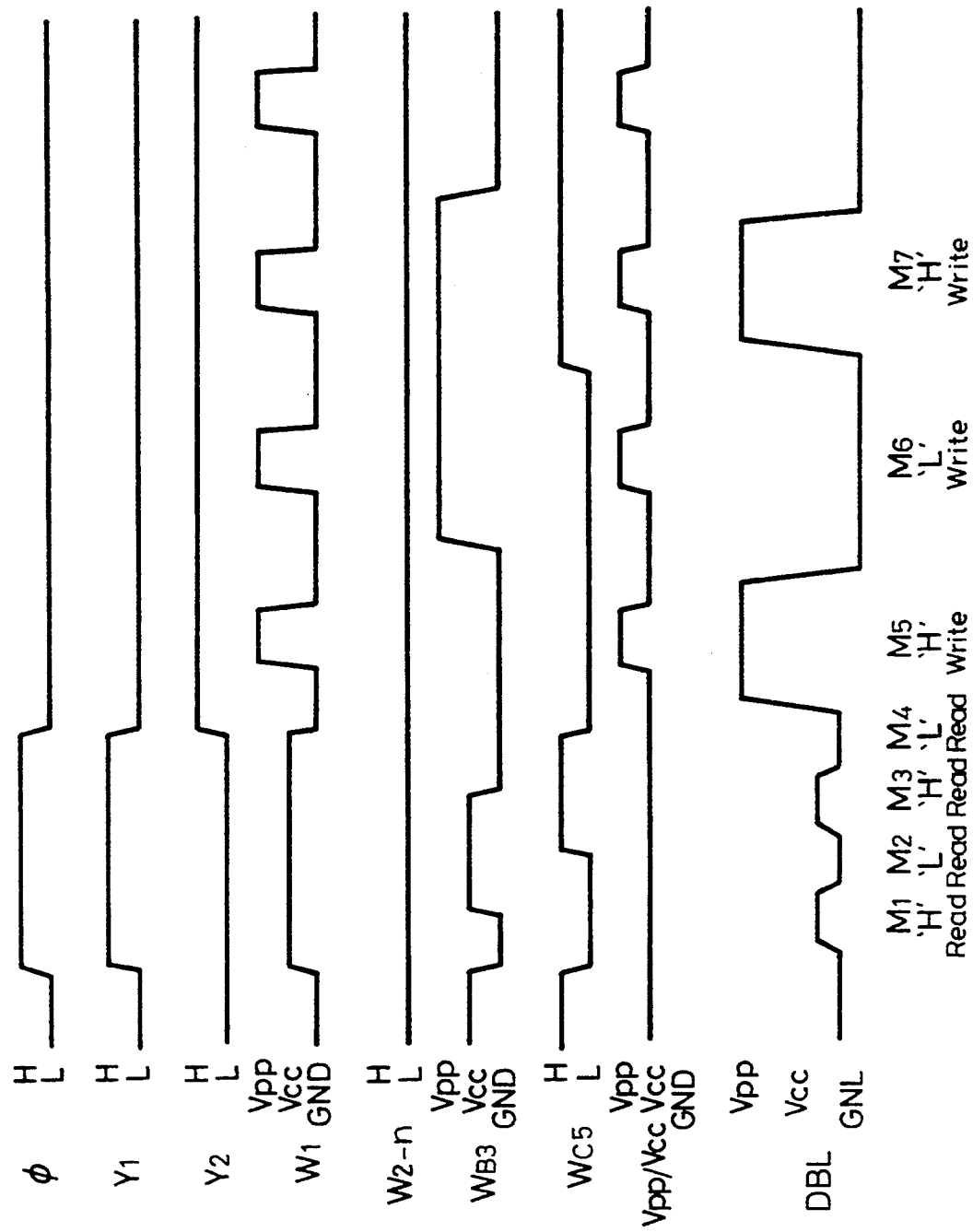
FIG. 4 is a timing chart of signal processing in the first embodiment.

As shown in FIG. 4, when the signal $\phi$ first becomes the low "L" level, each of the load transistors T18, T19, T21 and T22 of the load circuit 4 is turned off, and the load circuit 4 is electrically disconnected from the main bit line and main column lines.

Then, the signal Y1 is caused to fall, and the signal Y2 is caused to rise, so that the next group is selected by the first selecting means 1. The potentials of the selection lines WBS and WCS aye brought to be low "L" level so that the output $y_{13}$ of the AND circuit 13 becomes the high "H" level. At this time, the outputs $y_{11}$, $y_{12}$ and $y_{14}$ of the other AND circuit 11, 12 and 14 are at the low "L" level. Thus, since the output $y_{13}$ of the AND circuit 13 is at the high "H" level, the MOS transistors T14 and T15 are turned on.

As a result, the main bit line B2 and main column line C2 ape selected. At the same time, since the potentials of the selection lines $\overline{\text{WBS}}$ and $\overline{\text{WCS}}$ aye both the high "H" level, the MOS transistors T3 and T8 ape turned on, the main bit line B2 and the sub-bit line B22 are electrically connected, and the main column line C2 and the sub-column line C21 aye electrically connected.

Then, the potential of the data bus line DBL becomes the high "H" level of the low "L" level in accordance with the data being written. The "H" level potential is the high program potential Vpp, higher than the source voltage Vcc. When the voltage of the power supply to the level shifter portion is changed to Vpp, the output y13 of the AND circuit 13, and the potentials of the word line W1 and selection line WBS are both level-shifted to Vpp.

Thus, the memory cell M5 can be supplied with the potential of Vpp at its control gate, with earth potential Vss at its source with Vpp or earth potential Vss at its drain in accordance with the data being written, so that data can be written in the memory cell M5 selectively.

In other words, when the drain of the memory cell M5 is at Vpp, current flows in the channel of the memory cell M5. Of the electron/hole pairs generated at and around the drain, the electrons are injected into the floating gate, effecting the writing operation. When the drain of the memory cell M5 is at earth potential Vss, no current flows in the channel of the memory cell M5, or the writing operation is not performed. Thus, data can be written in the memory cell selectively in accordance with the data supplied on the data bus lien DBL.

Thereafter, by controlling the selection lines WBS and WCS in the same way as upon reading, it is possible to write desired data in the memory cells M6 and M7.

Thus, the non-volatile memory of this embodiment has the memory cells M1, M2 . . . M7 . . . of floating gate type insulating gate field effect transistors arranged in a matrix, the word lines W1 to Wn for the row selection, the sub-bit lines B12, B21, B22 and BB1, the sub-column lines C11, C12, C21 and C22, and the first, second and third selection means, or the column selection circuit 1, bit line selection circuit 2 and column line selection circuit 3. The word lines W1 to Wn are made of, for example, a polycrystalline silicon layer and formed to extend in parallel and to be respectively connected to the common gates of the floating gate type insulating gate field effect transistors of the rows of the memory cells. In addition, a group of ones of sub-bit lines B12, B21, B22 and B31, and ones of sub-column lines C11, C12, C21 and C22 is selected by the first selection means, or the column selection circuit 1. The even-numbered or odd-numbered sub-bit lines B12, B21, B22 and B31 of each selected group is selected and connected to the main bit line B1, B2 or B3 by the second selection means, or the bit line selection circuit 2. The even-numbered or odd-numbered sub-column line C11, C12, C21 and C22 of each selected group is selected and connected to the main column line C1 or C2 by the third selection means, or the column line selecting circuit 3. Thus, by fixing the main column line C1 or C2 to earth potential Vss selectively, it is possible to form a current path of main bit line—sub-bit line—memory cell—sub-column line—main column line (imaginary earth line) passing through only a particular memory cell.

In other words, the wiring pitch of the main bit lines B1, B2 and B3 and the main column lines C1 and C2 can be increased to twice the pitch of wiring (the sub-bit lines and sub-column lines, hereinafter referred to as the diffusion wiring) formed of the impurity diffused layer. Thus, the main bit lines B1, B2 and B3, and main column lines C1 and C2 can be made of metal wiring of aluminium or the like which has a larger arrangement pitch than the diffusion wiring. Therefore, since the pitch of the wiring drawn out of the memory cell array is much wider than that of the wiring within the memory cell array, the rule for the arrangement pitch of the output terminals of the peripheral circuits such as the column selection circuit 1 and the load circuit 4 is not severe, thus making the process design easy.

Figure 5:
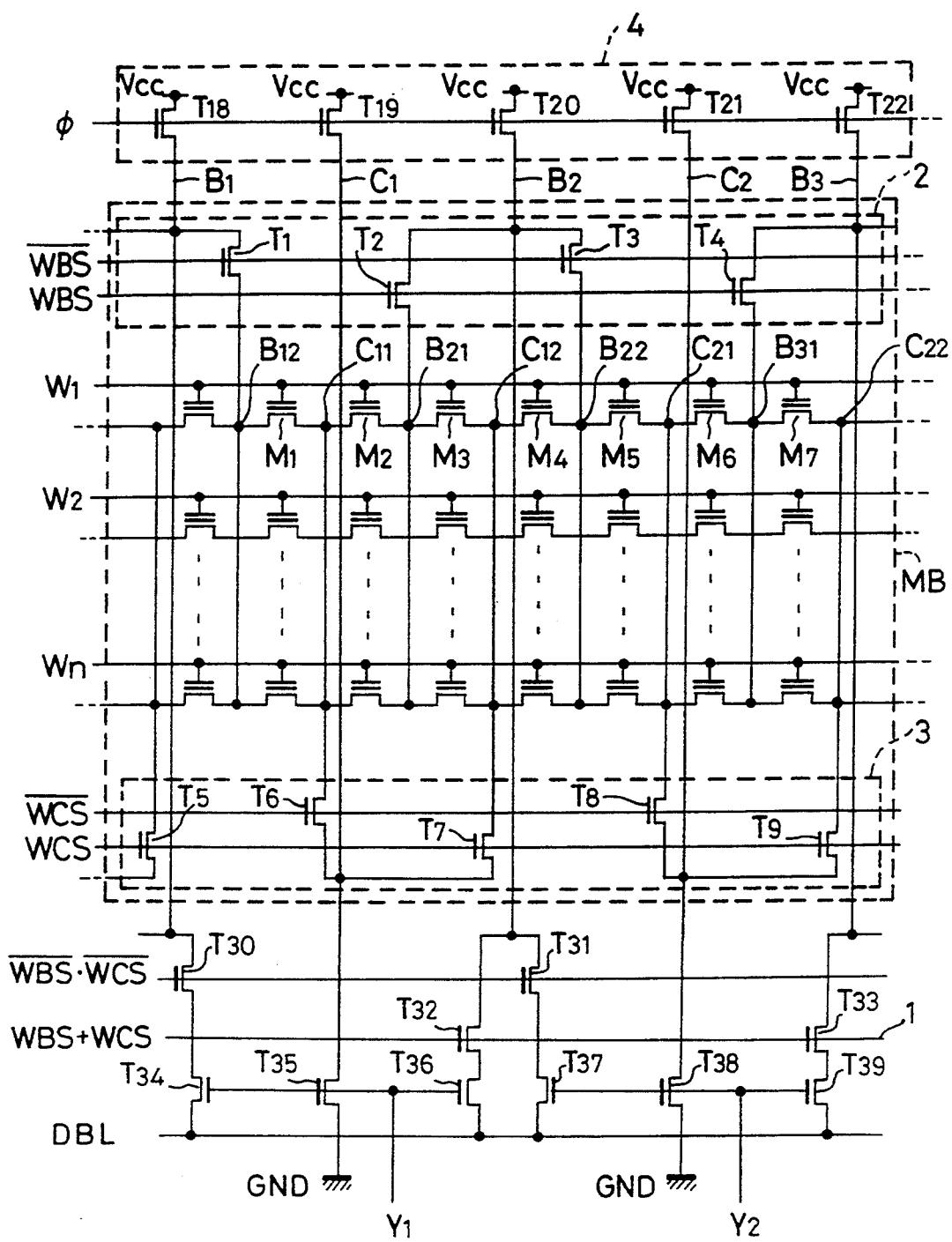
FIG. 5 is a circuit diagram of part of the non-volatile memory in a modification of the first embodiment.

A modification of the above embodiment will now be described with reference to FIG. 5.

The non-volatile memory of this modification, as illustrated, has substantially the same construction as the first embodiment, but is different therefrom in that the first selection means, that is the column selection circuit 1, includes no AND circuits with level shift functions.

In other words, the main bit line B1 is connected to the data bus line DBL through a parallel circuit of two serially connected MOS transistors, not shown, and two serially connected MOS transistors T30 and T34. The main bit line B2 is connected to the data bus line DBL through a parallel circuit of two serially connected MOS transistors T32 and T36 and two serially connected MOS transistors T31 and T27. The main bit line B3 is connected to the data bus line DBL through a parallel circuit of two serially connected MOS transistors T33 and T39 and two serially connected MOS transistors, not shown.

The main column line C1 is connected to the earth line GND through a MOS transistor T35, and the main column line C2 is connected to the earth line GND through a MOS transistor T38.

The gates of the MOS transistors T30 and T31 are supplied with the logic product of the $\overline{WBS}$ and $\overline{WCS}$, the gates of the MOS transistors T32 and T33 with the logic sum of WBS and WCS, the gates of the MOS transistors T34, T3D and T36 with one column selecting signals Y1, and the gates of the MOS transistors T37, T38 and T39 with the other column selecting signal Y2.

The reading operation will be described with reference to the timing chart of FIG. 4.

Since both the selection lines WBS and WCS are first placed at the low "L" level, the MOS transistors T1, T3 of the second selection means, or the bit line selection circuit 2 are turned on, and the MOS transistors T6 and T8 of the third selection means or the column line selection circuit 3, are turned on. The MOS transistors T2, T4, T5, T7 and T9 other than the bit line selection circuit 2 and the column line selection circuit 3 remain in the off-state.

At this time, the main bit line B1 is connected through the MOS transistor T1 to the sub-bit line B12 selectively, and the main column line C1 is connected through the MOS transistor T6 to the subcolumn line C11 selectively. Also, since the logical product of $\overline{WBS}$ and $\overline{WCS}$ is the high "H" level, the MOS transistors T30 and T31 are turned on. Since the signals Y1 is the high "H" level, the MOS transistors T34, T35, T36 are turned on.

Thus, the main bit line B1 is electrically connected to the data bus line DBL through the MOS transistors T30 and T34, and the main column line C1 is electrically connected to the earth line GND through the MOS transistor T35. Hence, the memory cell M1 is selected, and the potential of the sub-bit line B12 is changed in accordance with the data of the memory M1. The potential change appears on the data bus line through the main bit line B1.

In the next cycle, for the selection of the memory cell M2, the potential of the selection line WBS is shifted from the low "L" level to the high "H" level. At this time, the logical product of reverse WBS and reverse WCS is changed to the low "L" level, and the logical sum of WBS and WCS is changed to the high "H" level. As a result, the MOS transistor T30 is turned off, and the main bit line B1 is electrically disconnected from the data bus line DBL. In addition, the main column line C1 still remains electrically connected through the MOS transistor T35 to the earth line GND.

Moreover, since the logical sum of WBS and WCS is the high "H" level, this time the main bit line B2 is electrically connected through the MOS transistors T32 and T36 to the data bus line DBL. Since the selection line WCS stays at the low "L" level, the main column line C1 is connected through the MOS transistor T6 to the sub-column line C11. Also, since the selection line WBS is changed from the low "L" level to the high "H" level. The MOS transistor T2 is turned on and the MOS transistor T1 is turned off.

Therefore, the main bit line B2 is electrically connected through the MOS transistor T2 to the sub-bit line B21 selectively. Thus, since the sub-bit line B21 and the sub-column line C11 are selected, the memory cell M2 associated with the same word line W1 has been selected. In addition, as for the memory cell M1, the potential of the sub-bit line is changed in accordance with the data of the programmed memory cell M2. The potential change appears on the data bus line DBL through the main bit line B2.

In the next cycle, for the selection of the memory cell M3, the potential of the selection line WCS is shifted from the low "L" level to the high "H" level. At this time, the logical product of $\overline{WBS}$ and $\overline{WCS}$ remains the low "L" level, and the logical sum of WBS and WCS also remains the high "H" level. However, since the selection line WCS becomes the high "H" level, the MOS transistor T6 connected to the main column line C1 is turned off and the MOS transistor T7 is turned on.

As a result, the sub-column line C12, instead of the subcolumn line C11, is electrically connected to the main column line C1. Thus, the memory cell M3 has been selected. In addition, as for the memory cell M1, the potential of the sub-bit line B21 is changed in accordance with the programmed data, and the potential change appears on the data bus line DBL through the main bit line B2.

In the next cycle, the potential of the selection line WBS has fallen from the high "H" level to the low "L" level. The result is that the MOS transistor T2 is turned off and that the MOS transistor T3 is turned on. At this time, the sub-bit line B22 is electrically connected to the main bit line B2.

In this case, since the main column line C1 is already earthed and since the main column line C1 is electrically connected through the MOS transistor T7 to the sub-column line C12, the memory cell M4 which lies between the sub-column line C12 and the sub-bit line B22 is selected. In addition, similarly to the above, the potential of the sub-bit line B22 is changed in accordance with the data programmed in the memory cell M4, and the potential change appears on the data bus line DBL through the main bit line B2.

The data writing operation for the memory cells M5 to M7 will now be described in order.

First, when the signal $\phi$ becomes the low "L" level, the load transistors T18, T19, T21 and T22 of the load circuit 4 are turned off, and thus the load circuit 4 is electrically disconnected from the main bit lines and main column lines.

Then, when the signal Y1 has fallen, and when the signal Y2 has risen, the column selection circuit 1 selects the next group. When the potentials of the selection lines WBS and WCS are the low "L" level, the logical product of the $\overline{WBS}$ and $\overline{WCS}$ is changed to the high "H" level, and the logical sum of WBS and WCS is changed to the low "L" level. Thus, the MOS transistors T31, T37, T38 and T39 are turned on.

Consequently, the main bit line B2 and the main column line C2 are selected. At the same time, since the potentials of the selection lines $\overline{WBS}$ and $\overline{WCS}$ are both the high "H" level, the MOS transistors T3 and T8 are turned on, the main bit line B2 and sub-bit line B22 are electrically connected, and the main column line C2 and sub-column line C21 are electrically connected.

Then, the potential of the data bus line DBL is caused to be the high "H" level or the low "L" level in accordance with the data being written. The "H" level potential is the program potential Vpp which is higher than the source voltage Vcc. When the power supply Vpp/Vcc to the level shifter portion is changed to Vpp, the potential of the word line W1 and the potential of the selection line WBS are both shifted to the level Vpp.

Thus, the memory cell M5 has its control gate supplied with the potential Vpp, its source supplied with earth potential Vss, and its drain supplied with Vpp of Vss in accordance with the data being written. Therefore, data can be written in the memory cell M5 selectively.

Thereafter, by controlling the selection lines WBS and WCS in the same way as upon reading, it is possible to write desired data in the memory cells M6 and M7.

With this modification, AND circuits with level shift functions and complicated construction need not be used for the column selection circuit 1 of the first selection means, and instead a simple combination of MOS transistors can constitute the column selection circuit. Thus, the peripheral circuits can be simplified in construction, and hence the non-volatile memory itself can be simplified in construction and small-sized.

Figure 6:
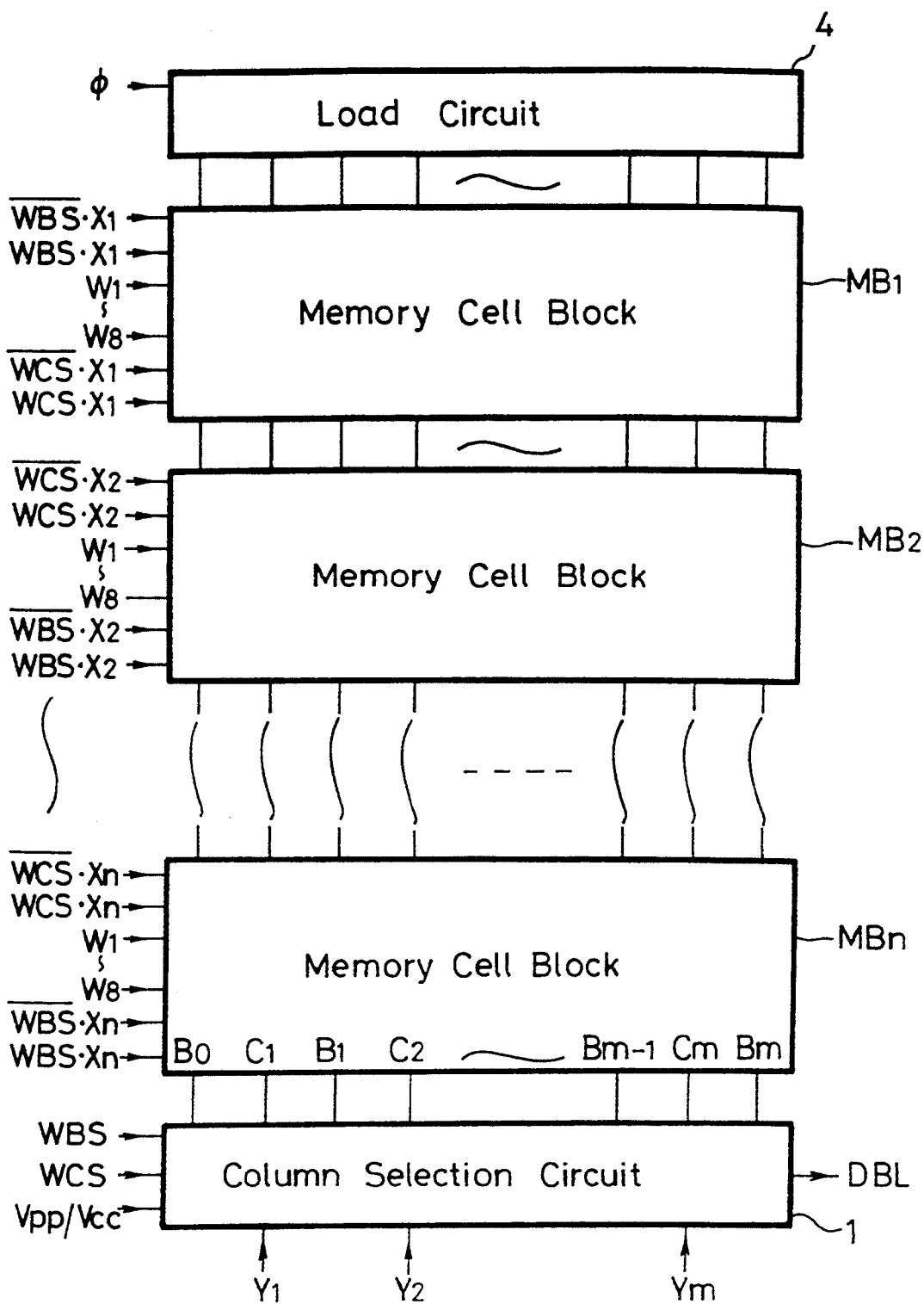
FIG. 6 is a block diagram of a second embodiment of non-volatile memory according to the present invention.

A second embodiment in which the above memory block is divided will now be described with reference to FIG. 6. While in this embodiment eight word lines W aye used Fop each of the divided memory cell blocks MB, the number of word lines W is not limited to eight, but may be increased Of decreased if necessary.

The non-volatile memory according to the second embodiment, as illustrated, has n memory cell blocks MB1, MB2 . . . MBn arranged in the direction perpendicular to the extension direction of the word lines W.

Each of these memory cell blocks MB1, MB2 . . . MBn has sub-column lines and sub-bit lines alternately arranged and used in the steady state, memory cells arranged in a matrix, the second selection means controlled by selection lines WBS.X1—WBS.Xn and $\overline{WBS}$.X1—$\overline{WBS}$.Xn, or the MOS transistors constituting the bit line selection circuit 2, and the third selection means controlled by selection lines WCS.X1—WCS.Xn and $\overline{WCS}$.X1—$\overline{WCS}$.Xn, of the MOS transistors constituting the column line selection circuit 3. For example, the selection line WBS.X1 indicates the logical product of the selection line WBS and the selection line X1.

Since the first-mentioned memory cell block is divided into the memory cell blocks MB1, MB2 . . . MBn, the sub-column lines and sub-bit lines, although not shown, within each memory cell block are shorter in the direction perpendicular to the extension direction of the word lines than in the previous memory cell block. Thus, the wiring resistance and parasitic capacitance can be reduced, and hence the memory cell block is capable of high speed operation. Particularly, as will be described later, this is advantageous in forming the sub-bit lines and sub-column lines with the impurity-diffused layer.

Figure 7:
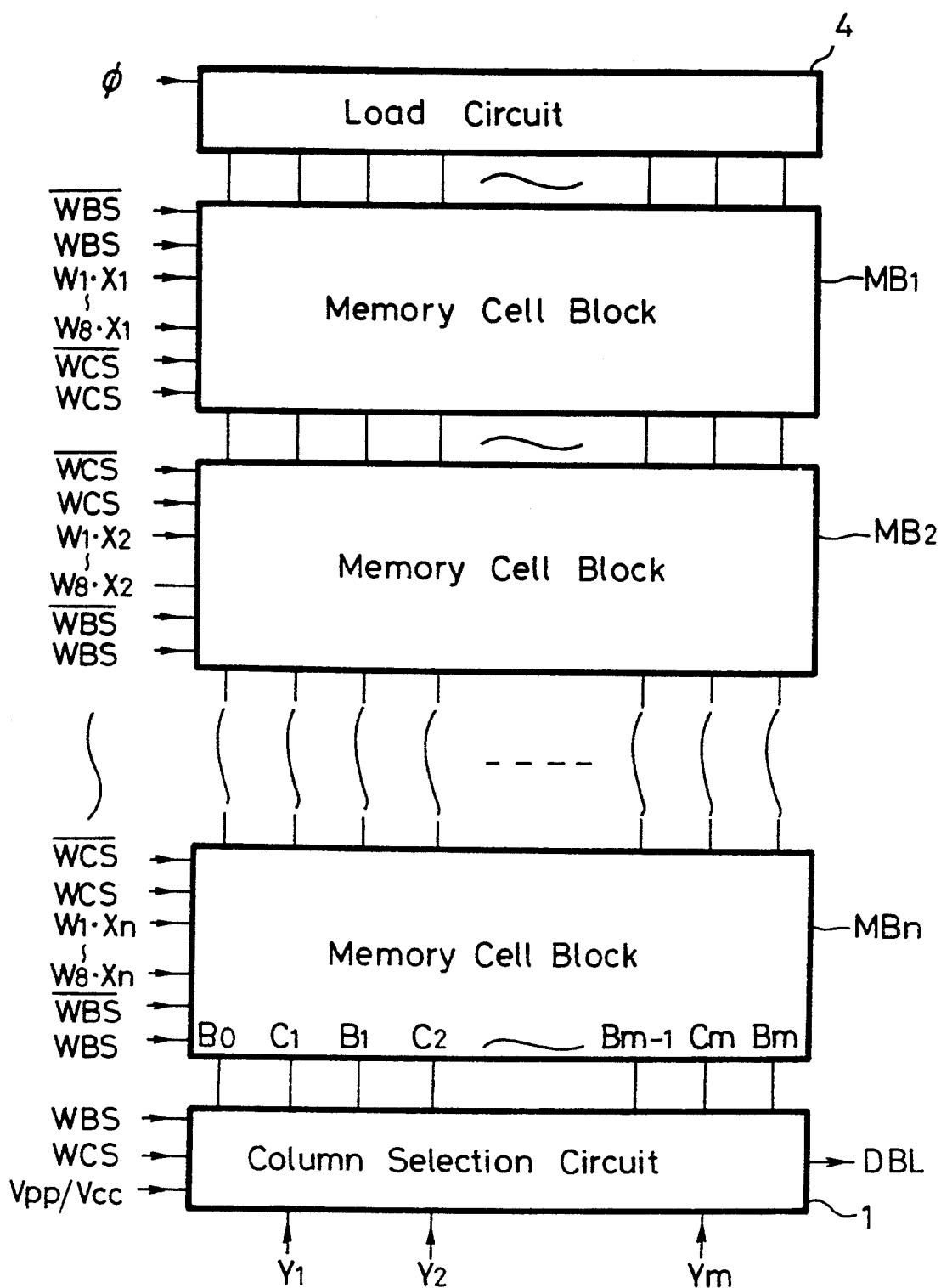
FIG. 7 is a block diagram of the non-volatile memory in a modification of the second embodiment.

FIG. 7 shows a modification of the second embodiment. For a way to divide the memory cell block, only the word lines of a particular memory cell block may be selected by controlling the word lines (W1.X1, W2.X1, ... W8.X1), (W1.X2, W2.X2 ... W8.X2), ... W1.Xn, W2.Xn, ... W8.Xn). In FIGS. 6 and 7, B0, B1 ... Bm−1, Bm indicate main bit lines, and C1, C2 ... Cm are main column lines.

The main bit lines B0-Bm are provided common to the n memory cell blocks MB1, MB2 ... MBn. The main bit lines B0-Bm are formed in the same direction as the sub-bit lines within each memory cell block. In addition, the main column lines C1-Cm are provided common to the n memory cell blocks MB1, MB2 ... MBn. These main column lines C1-Cm are also provided in parallel with the main bit lines. The main bit lines B0-Bm and the main column lines C1-Cm are alternately arranged in the extension direction of the word lines.

The load circuit 4 is provided on the end of the memory cell block MB1 as viewed in the direction perpendicular to the extension direction of the word lines W. The load circuit 4 is supplied with the signal $\phi$ for controlling the impedances of the MOS transistors constituting the load circuit 4. Since the main bit lines B0-Bm and the main column lines C1-Cm are used common to the memory cell blocks MB1, MB2 ... MBn, the load circuit 4 may be provided on the end of the whole memory cell block MB. This enables the occupied area to be reduced, and hence the memory can be integrated at a high density.

The column selection circuit 1 as the first selection means is provided on the other end of the whole memory cell block MB1, MB2 ... MBn as viewed in the direction perpendicular to the extension direction of the word lines W. This column selection circuit 1 is connected with the power supplied line Vpp/Vcc to the selection lines WBS and WCS and level shifter, and is also supplied with the decode signals Y1-Ym for column selection from the column decoder. These signals select one group of one main column line and one main bit line, so that the above reading operation is performed.

Thus, since the main bit lines B0-Bm and main column lines C1-Cm are shared by the memory cell blocks MB1, MB2 ... MBn, the column selection circuit 1 can be provided on the other end of the whole memory cell block MB as is the load circuit 4. This enables the occupies area to be reduced, and hence the memory can be integrated at a high density.

Figure 8:
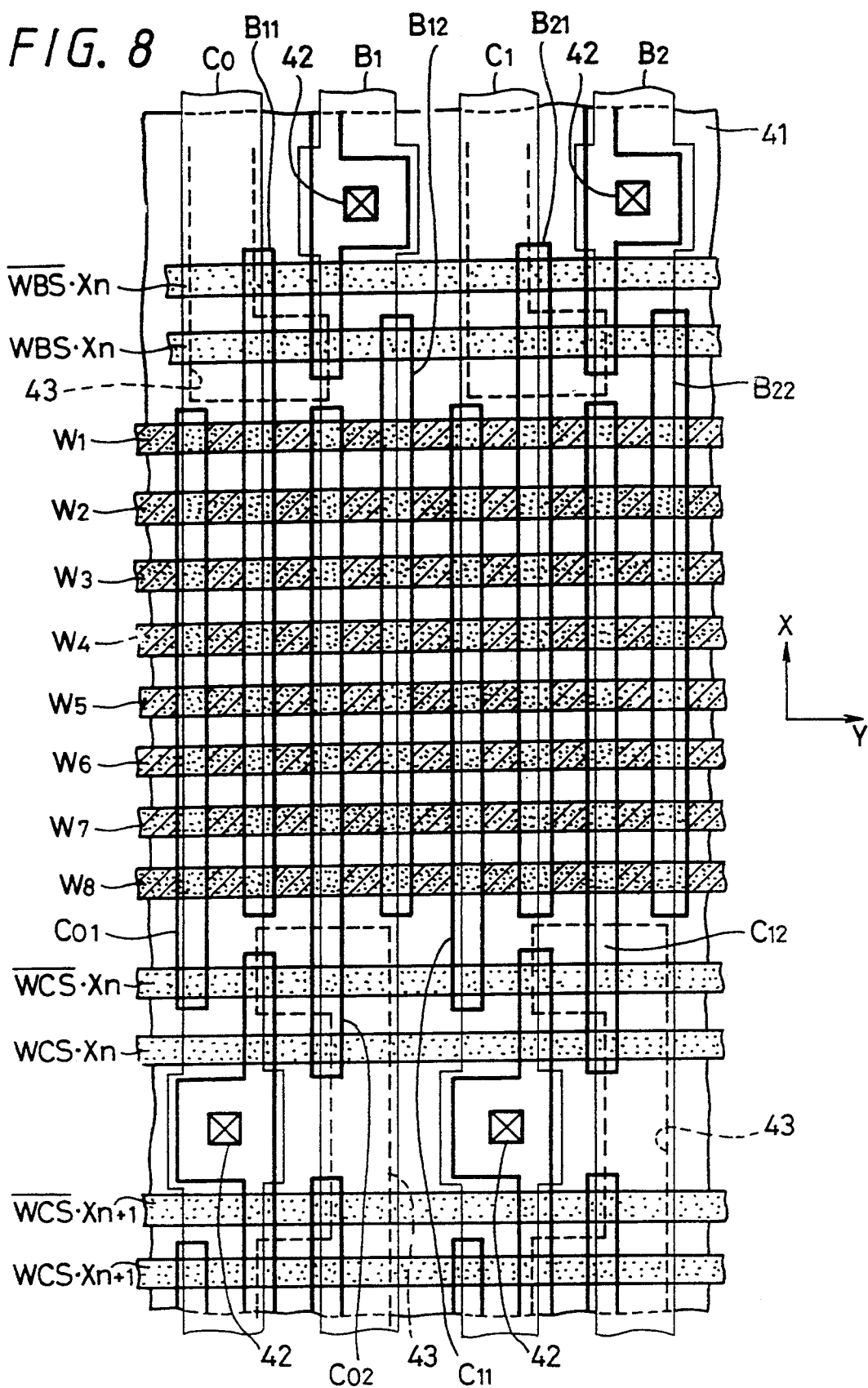
FIG. 8 is a plan view of the pattern layout of a memory cell block of the second embodiment.
Figure 9:
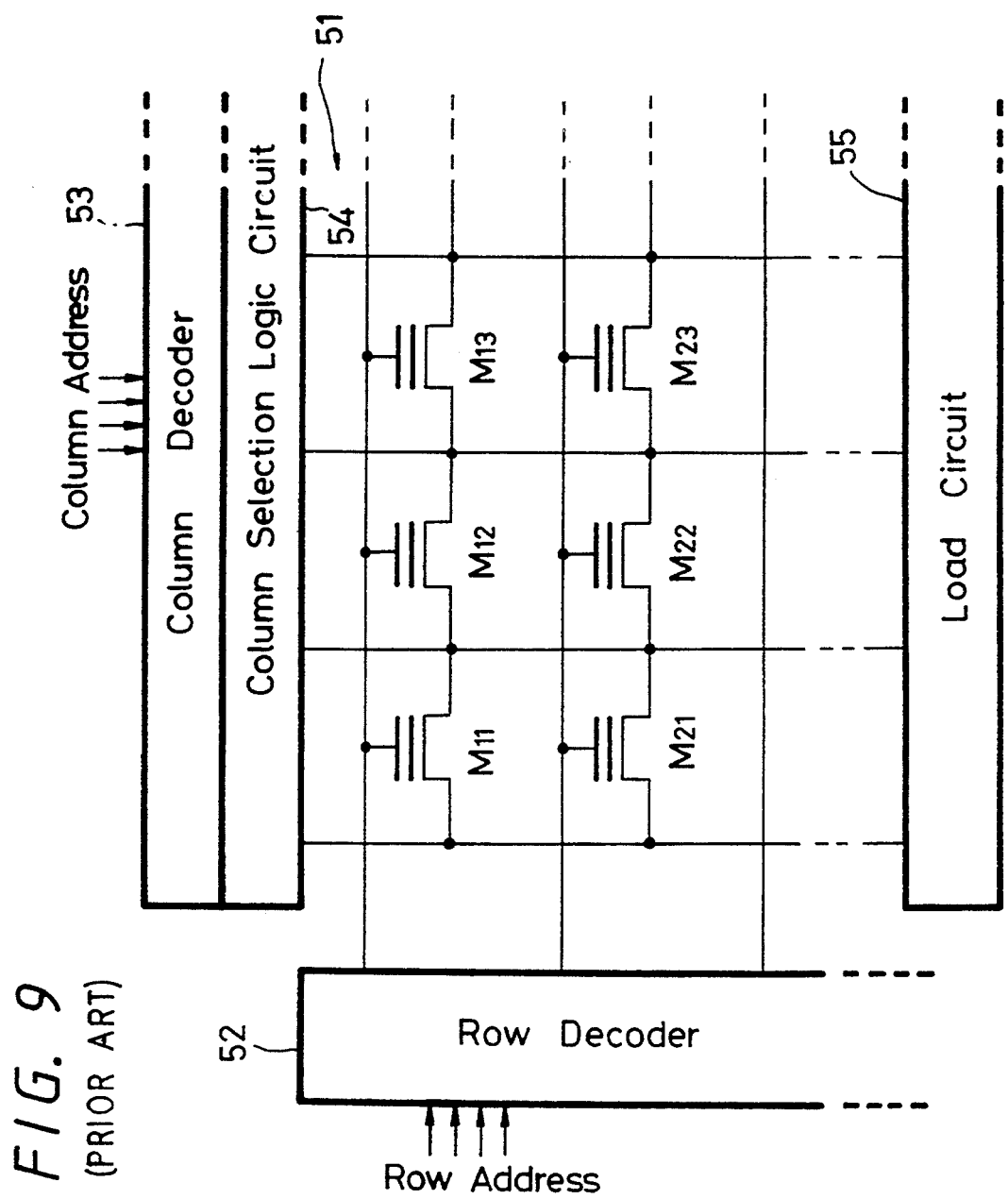
FIG. 9 is a circuit diagram showing the connection of a memory cell array and peripheral circuits in a previously proposed non-volatile memory.
Figure 10:
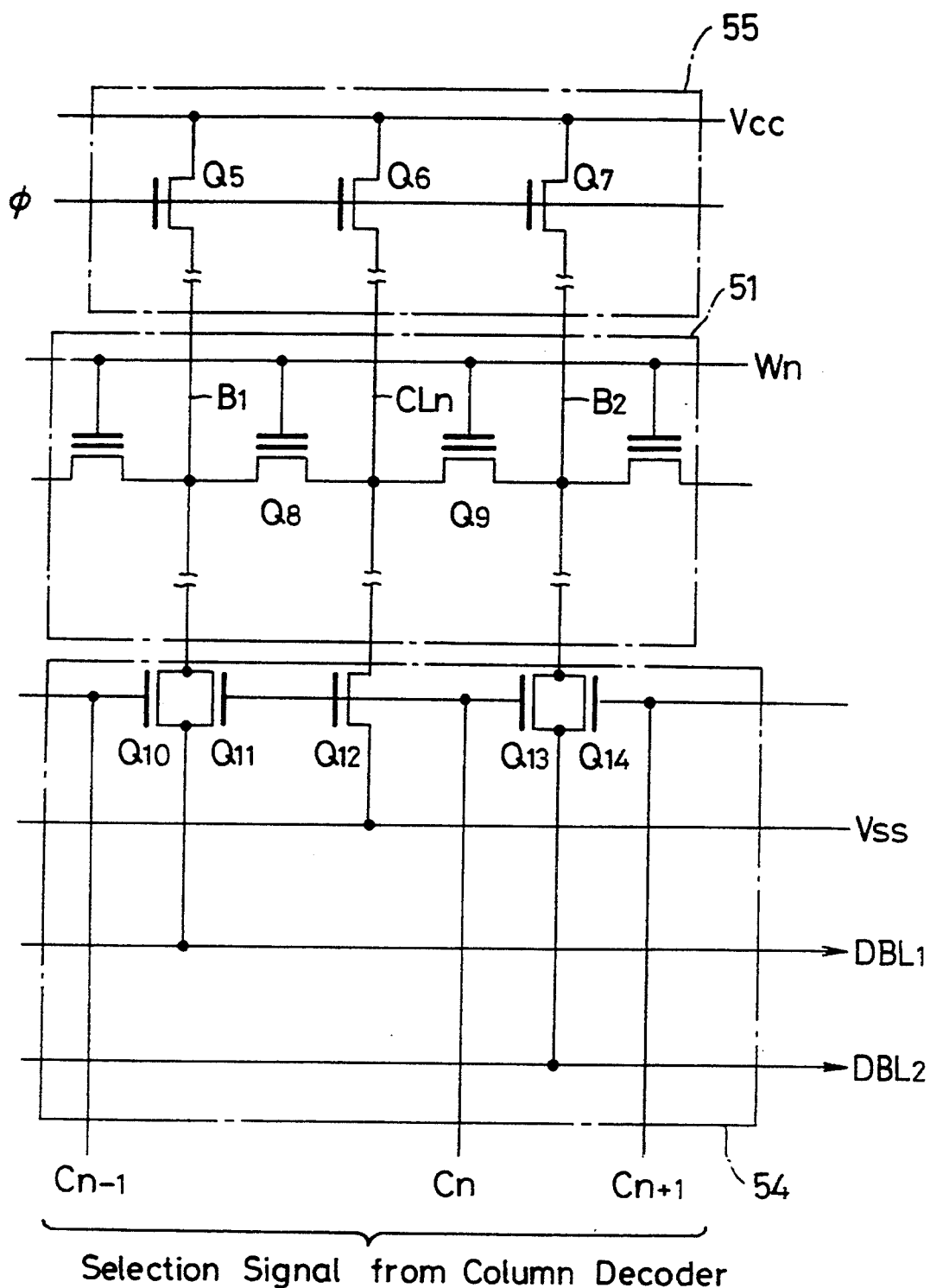
FIG. 10 is a circuit diagram of part of the non-volatile memory of FIG. 9.
Figure 11:
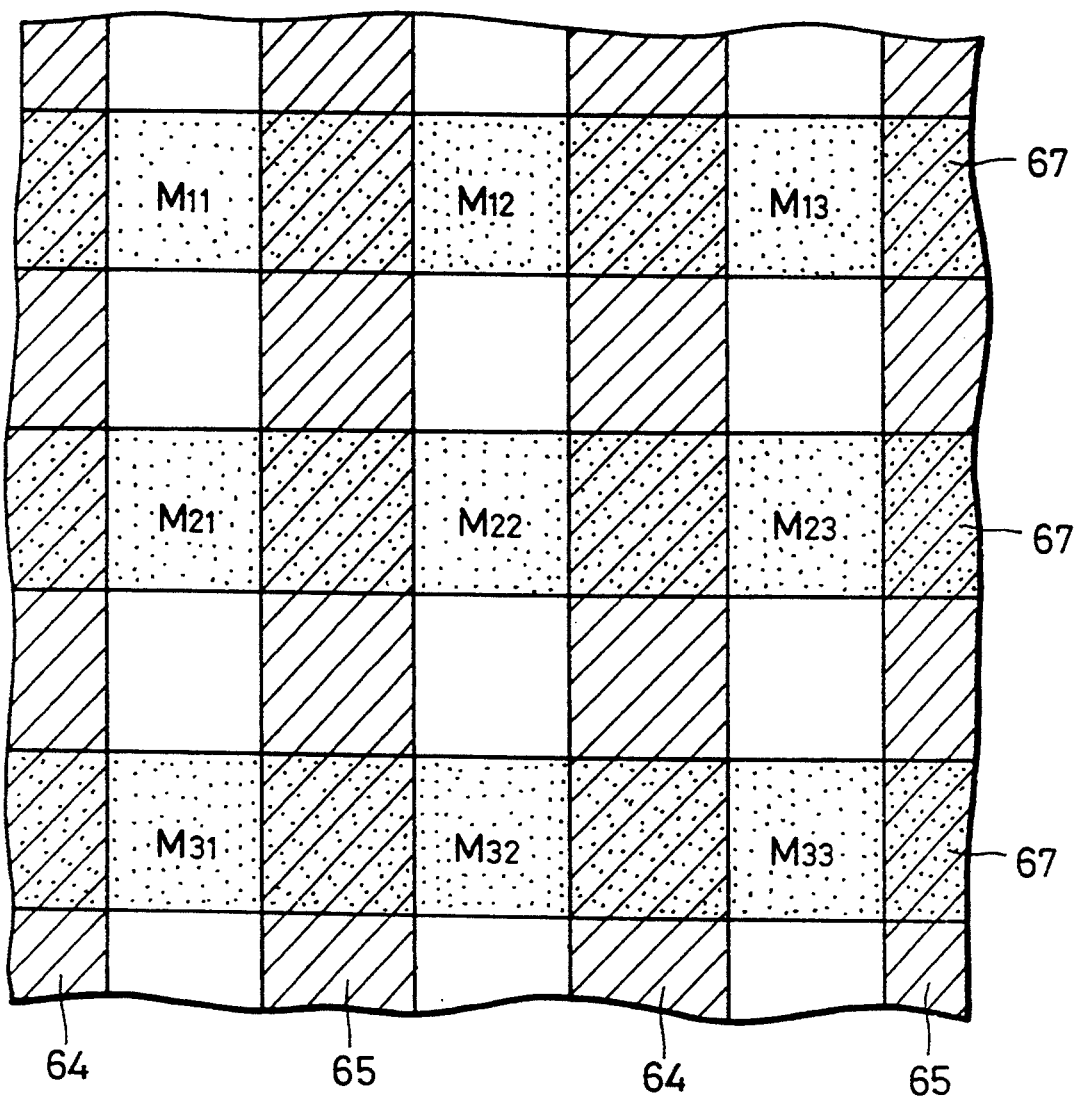
FIG. 11 is a plan view showing the arrangement of the memory cells of the non-volatile memory of FIG. 9.
Figure 12:
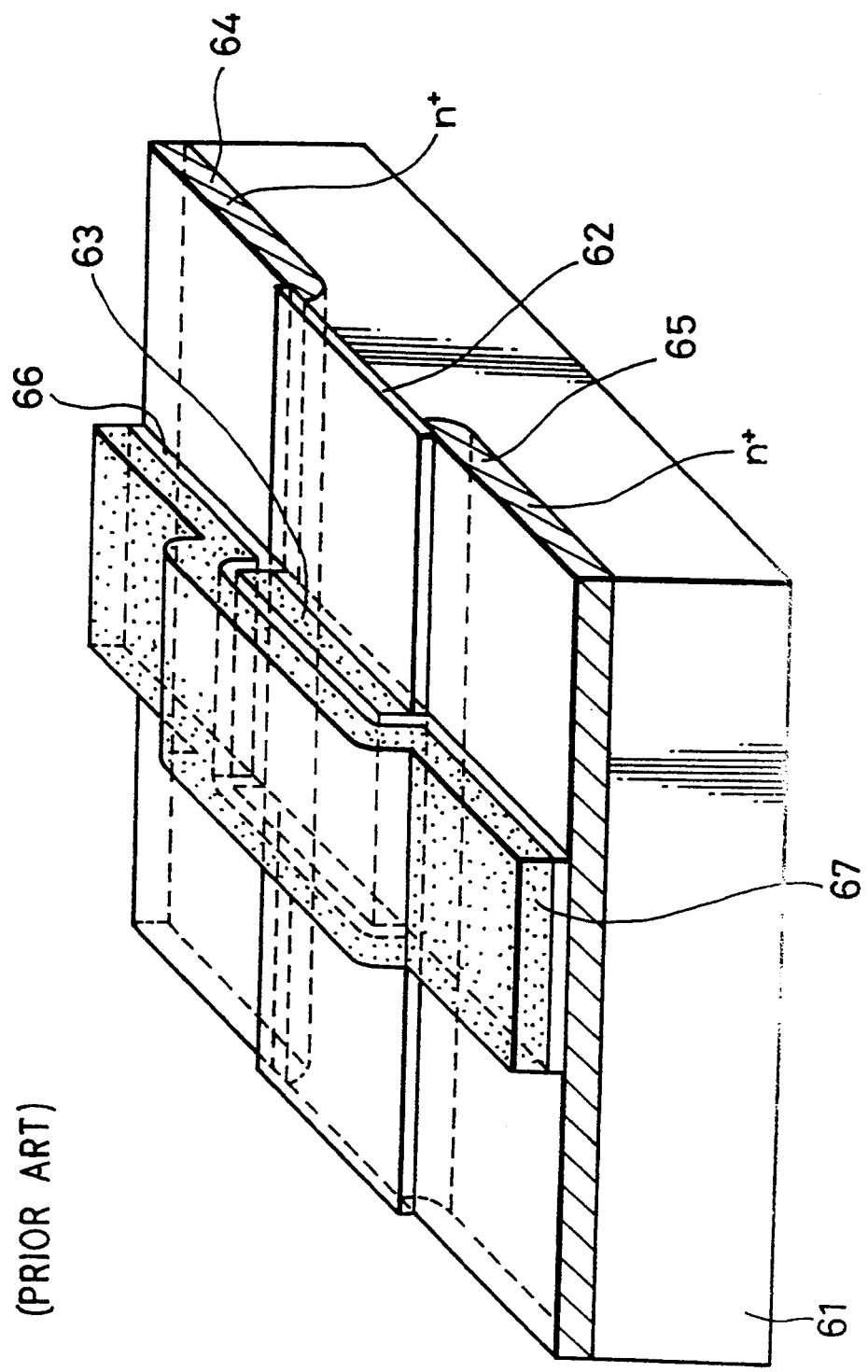
FIG. 12 shows a perspective view of the structure of high-density integrated memory cells.

The pattern layout of the memory cell block MB will be described with reference to FIG. 8. For convenience of explanation, only a part of the layout drawing is shown in FIG. 8. The actual layout pattern of the memory cell block is a continuous repetition of such pattern as shown in FIG. 8 in the X and Y-direction.

This memory cell block MB has formed on a silicon substrate 41 the word lines W1-W8 and selection lines $\overline{WBS}$.Wn, WBS.Xn, $\overline{WCS}$.Xn, WCS.Xn which are made of a plurality of second polycrystalline silicon layers as indicated by the dotted, or grey regions. Particularly, the hatched grey areas of the word lines W1-W8 has the floating gate formed by the first polycrystalline silicon layer which underlies the second polycrystalline silicon layer through an insulating film, and also has the channel formed under this floating gate through a gate insulating film.

In this layout, the region between a pair of series of contact holes 42, 42 which series extend in parallel in the X-direction is one memory cell block MB. This memory cell block MB includes eight word lines W1-W8, and selection lines $\overline{WBS}$.Xn, WBS.Xn, selection lines $\overline{WCS}$.Xn, WCS.Xn which are made of the second polycrystalline silicon layer so as to be shaped like bands. These lines are spaced at a predetermined distance and the ion implantation for preventing channels from being formed is performed in a self matching manner. Also, the ion implantation for preventing channel from being formed is performed by using mask patterns 43 shown by the broken lines in the figure.

The sub-bit lines B11, B12, B21 and B22 and sub-column lines C01, C02, C11 and C12, as indicated by the bold solid lines in the figure, are formed to extend in the X-direction by the silicon substrate and the impurity-diffused layer. The sub-bit lines B11, B12, B21 and B22 and sub-column lines C01, C02, C11 and C12 are formed in band-shaped patterns and used as the source/drain regions of the respective memory cells.

The impurity-diffused layers of the sub-bit lines B11, B12, B21 and B22 and sub-column lines C01, C02, C11 and C12 are alternately arranged with a predetermined spacing. The silicon substrate 41 under the second polycrystalline silicon layer patterns which intersect at right angles with the impurity-diffused layers is used for channels. On the channels, there are formed the floating gates by the first polycrystalline silicon layer through the gate insulating film.

With embodiments of the invention, even although the memory cells are formed at a high density by use of the impurity-diffused layers of bit lines and column lines, the wiring resistance and the parasitic capacitance can be suppressed from being increased, and thus it is possible to achieve high-density and high-integration of the memory cells and high-speed access to the memory cells.

I claim:

1. A non-volatile memory device comprising:
   a plurality of non-volatile read/write memory cells (M) arranged in a matrix configuration (WB) and including floating gate type MIS transistors to be programmed to a high threshold voltage or to a low threshold voltage in accordance with programmed data to be written;
   a plurality of word lines ($W_1$ to $W_n$) used in common in each row of said memory cells (M) and functioning as gates of said MIS transistors;
   a row selection means having outputs connected to said word lines to select one of said word lines ($W_1$ to $W_n$) and to modify voltage levels of said word lines ($W_l$ to $W_n$) for selectively programming said memory cells;
   a plurality of sub-bit lines (B12, B21, B22, B31) arranged substantially orthogonally to said word lines ($W_1$ to $W_n$), wherein said sub-bit lines (B12, B21, B22, B31) function as one of the sources or the drains of said MIS transistors and are used in common by one of adjacent columns of said memory cells (M), and are formed as diffusion regions by introducing impurities of an opposite conductivity type into a substrate surface;

a plurality of sub-column lines (C11, C12, C21, C22) arranged between said sub-bit lines (B12, B21, B22, B31), wherein said sub-column lines (C11, C12, C21, C22) are used in common by the other of adjacent sub-columns of said memory cells (M) and function as the other of said sources or drains of said MIS transistors of columns of said memory cells (M), and are formed as diffusion regions by introducing impurities of an opposite conductivity type into a substrate surface;

characterized in that:

first selection means (1) is arranged for selecting groups each consisting of a plurality of said sub-bit lines (B12, B21, B22, B31) and a plurality of said sub-column lines (C11, C12, C21, C22);

second selection means (2) is arranged for selecting said sub-bit lines (B12, B21, B22, B31) in each group and to connect said sub-bit lines (B12, B21, B22, B31) to main-bit lines (B1, B2, B3); and third selection means (3) is arranged for selecting said sub-column lines (C11, C12, C21, C22) in each group and to connect said sub-column lines (C11, C12, C21, C22) to main-column lines (C1, C2).

2. A device according to claim 1 wherein said second and third selection means (2, 3) comprise insulated gate field effect transistors.

3. A device according to claim 1 wherein said second and third selection means (2, 3) comprise insulated gate field effect transistors of the same conductivity type as said MIS transistors.

4. A device according to claim 2 or claim 3 wherein said sub-bit lines (B12, B21, B22, B31) and said sub-column lines (C11, C12, C21, C22) are formed in a striped pattern on a substrate and in a direction substantially orthogonal to the longitudinal direction of said insulated gate field effect transistors of said second and third selection means (2, 3).

5. A device according to claim 1 wherein said second selection means (2) is arranged in opposition to said third selection means (3) with an array of said memory cells (M) between.

6. A device according to claim 1 wherein said memory cells (M) in the matrix configuration (MB) are divided into blocks along the sub-bit lines (B12, B21, B22, B31) and wherein said first selection means (1) is used in common in each block.

7. A device according to any one of claims 1-3 wherein load circuits (4) are arranged at terminal ends of each bit line (B1, B2, B3) and each column line (C1, C2).

8. A device according to claim 7 wherein said memory cells (M) in matrix configuration (MB) are divided into blocks along the bit lines (B1, B2, B3), and wherein the load circuits (4) are used in common by each block.

9. A device according to any one of claims 1-3 wherein said main-bit lines (B1, B2, B3) and said main-column lines (C1, C2) are formed overlying said sub-bit lines (B12, B21, B22, B31).

10. A device according to claim 9 wherein said main-bit lines (B1, B2, B3) and said main-column lines (C1, C2) are made of metal or other low resistance material.

11. A non-volatile memory device comprising:

a plurality of non-volatile read/write memory cells (M) arranged in a matrix configuration (WB) and including floating gate type MIS transistors, and wherein said memory cells (M) are divided into a plurality of blocks along main-bit lines (B1, B2, B3);

a plurality of word lines ($W_1$ to $W_n$) used in common in each row of said memory cells (M) and functioning as gates of said MIS transistors;

a row selection means having outputs connected to said word lines to select one of said word lines ($W_1$ to $W_n$) and to modify voltage levels of said word lines ($W_1$ to $W_n$) for selectively writing into said memory cells;

a plurality of sub-bit lines (B12, B21, B22, B31) arranged substantially orthogonally to said word lines ($W_1$ to $W_n$), wherein said sub-bit lines (B12, B21, B22, B31) function as one of the sources or the drains of said MIS transistors and are used in common by one of adjacent columns of said memory cells (M), and are formed as diffusion regions by introducing impurities of an opposite conductivity type into a substrate surface; and a plurality of sub-column lines (C11, C12, C21, C22) arranged between said sub-bit lines (B12, B21, B22, B31), in alternation with and parallel to said bit lines (B1, B2, B3), wherein said sub-column lines (C11, C12, C21, C22) are used in common by the other of adjacent sub-columns of said memory cells (M) and function as the other of said sources or drains of said MIS transistors of columns of said memory cells (M), and are formed as diffusion regions by introducing impurities of an opposite conductivity type into a substrate surface;

characterized in that:

first selection means (1) is arranged for selecting groups each consisting of a plurality of said sub-bit lines (B12, B21, B22, B31) and a plurality of said sub-column lines (C11, C12, C21, C22) in common in each block;

second selection means (2) is arranged for selecting said sub-bit lines (B12, B21, B22, B31) in each group to connect said sub-bit lines (B12, B21, B22, B31) to main-bit lines (B1, B2, B3);

third selection means (3) is arranged for selecting said sub-column lines (C11, C12, C21, C22) in each group and to connect said sub-column lines (C11, C12, C21, C22) to main-column lines (C1, C2);

load circuits (4) are arranged at terminal ends of each main-bit line (B1, B2, B3) and each main-column line (B. C) (C1, C2); and fourth selection means is provided for selecting one of said blocks;

wherein one of said blocks is selected said second selection means (2) and said third selection means (3) in said one of said blocks.

12. A device according to claim 11 wherein said fourth selection means selects the second selection means (2), and the third selection means (3) belonging to one of said blocks.

13. A device according to claim 11 wherein said fourth selection means selects all said word lines (W1 to Wn) belonging to one of said blocks.

14. A device according to claim 12 wherein said word lines (W1 to Wn) are used in common in each block.

15. A device according to claim 11 wherein control signals (WBS, $\overline{\text{WBS}}$) of said second selection means (2) and control signals (WCS, $\overline{\text{WCS}}$) of said third selection means (3) are used in common in each blocks.

16. A device according to claim 11 wherein said main-bit lines (B1, B2, B3) and said main-column lines (C1, C2) ape formed overlying said sub-bit lines (B12, B21, B22, B31).

17. A device according to claim 12 wherein said main-bit lines (B1, B2, B3) and said main-column lines (C1, C2) are made of metal or other low resistance material.

* * * * *